United States Patent
Kim et al.

(10) Patent No.: US 8,085,606 B2
(45) Date of Patent: Dec. 27, 2011

(54) INPUT-OUTPUT LINE SENSE AMPLIFIER HAVING ADJUSTABLE OUTPUT DRIVE CAPABILITY

(75) Inventors: Kang Yong Kim, Boise, ID (US); Chulmin Jung, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 129 days.

(21) Appl. No.: 12/549,200

(22) Filed: Aug. 27, 2009

(65) Prior Publication Data

US 2009/0316496 A1 Dec. 24, 2009

Related U.S. Application Data

(62) Division of application No. 11/706,937, filed on Feb. 14, 2007, now Pat. No. 7,596,039.

(51) Int. Cl.
*G11C 11/00* (2006.01)
*G11C 7/00* (2006.01)
*G11C 7/02* (2006.01)

(52) U.S. Cl. ............ 365/189.15; 365/189.17; 365/205; 365/207

(58) Field of Classification Search ............ 365/189.17, 365/205, 207
See application file for complete search history.

(56) References Cited

U.S. PATENT DOCUMENTS

| | | | | |
|---|---|---|---|---|
| 5,060,196 | A | 10/1991 | Pae et al. | 365/189.05 |
| 5,917,758 | A | 6/1999 | Keeth | 365/189.05 |
| 6,047,346 | A | 4/2000 | Lau et al. | 710/126 |
| 6,121,806 | A | 9/2000 | Kono et al. | 327/205 |
| 6,278,636 | B1 * | 8/2001 | Lee | 365/189.15 |
| 6,310,809 | B1 | 10/2001 | Roohparvar et al. | 365/203 |
| 6,438,043 | B2 | 8/2002 | Gans et al. | 365/194 |
| 6,522,160 | B1 | 2/2003 | Zivanovic | 324/765 |
| 6,556,485 | B2 * | 4/2003 | Shimizu et al. | 365/189.05 |
| 6,922,372 | B2 * | 7/2005 | Suzuki | 365/189.15 |
| 6,940,777 | B2 | 9/2005 | Ooishi | 365/226 |
| 7,038,963 | B2 | 5/2006 | Lee | 365/207 |
| 2002/0060942 | A1* | 5/2002 | Akiyama et al. | 365/226 |
| 2002/0070762 | A1 | 6/2002 | You et al. | 327/55 |
| 2002/0141246 | A1* | 10/2002 | Shimizu et al. | 365/189.05 |
| 2005/0127998 | A1 | 6/2005 | Maekawa et al. | 330/253 |
| 2006/0097759 | A1 | 5/2006 | Omori et al. | 327/108 |

* cited by examiner

*Primary Examiner* — Ly D Pham
(74) *Attorney, Agent, or Firm* — Dorsey & Whitney LLP

(57) ABSTRACT

An input-output line sense amplifier configured to drive input data signals over an input-output signal line to an output driver circuit, the input-output line sense amplifier having an output driver stage having a plurality of different programmable output drive capacities to tailor the output drive of the sense amplifier.

12 Claims, 6 Drawing Sheets

INPUT-OUTPUT LINE SENSE AMPLIFIER HAVING ADJUSTABLE OUTPUT DRIVE CAPABILITY

CROSS-REFERENCE TO RELATED APPLICATION

This application is a divisional of U.S. patent application Ser. No. 11/706,937 filed Feb. 14, 2007 and issued as U.S. Pat. No. 7,596,039 B2 on Sep. 29, 2009. This application and patent are incorporated by reference herein, in their entirety, for any purpose.

TECHNICAL FIELD

Embodiments of the present invention relate generally to memory systems, and more specifically, to memory systems having sense amplifiers for driving data signals on input-output signal lines.

BACKGROUND

Memory systems in electronic systems are typically used to store data for retrieval at a later time. Memory systems come in different types of memory. For example, one type of memory is a "volatile" memory, which can store data only when supplied with power. Volatile memory systems are typically designed as dynamic random access memory (DRAM) or static random access memory (SRAM) systems, each having different memory cell configurations. These types of memory systems are often used in computer systems and other processor-based systems for storing data used during processing. Another type of memory system is a "non-volatile" memory system, which can store data even when power is not supplied. There are different designs for non-volatile memory, including NAND-type flash memory and NOR-type flash memory, each having a different memory cell arrangement and manner of accessing data stored by the memory cells. Non-volatile memory systems are used in applications where data should be continuously stored, even when the electronic system including the non-volatile memory is switched off. Cellular phones, digital cameras, personal digital assistants, digital music players, are some examples of where non-volatile memory systems are used.

Memory systems can also be implemented in different forms. For example, a memory system can be implemented as an individual memory device. Individual memory devices can be electrically coupled and mounted together on a common substrate to form a memory module, which is then coupled to an electronic system, such as a computer system. Individual memory devices can also be electrically coupled and mounted to a substrate on which other components of an electronic system are also mounted. Memory systems can also be "embedded" in an electronic system. That is, the memory system is formed on a common semiconductor with other electrical circuitry of an electrical system. As illustrated by the previous discussion, memory systems come in different types and arrangements, and are used in a wide range of electronic systems.

In many portable electronics applications which utilize batteries for supplying power, having a memory system designed for low power consumption is desirable. There are many different approaches to reducing power consumption of memory systems, many of which focus on reducing power consumption of memory systems during access operations, such as reading data from or writing data to a memory array. However, reduced power consumption can often compromise the speed of the memory system. As known, operation of memory systems involve driving electrical signals over internal signal lines. The electrical signals can represent internal control signals, data signals, clock signals, as well as other signals. Proper operation of a memory system require that these electrical signals are driven to required signal levels. In a memory system designed for lower power consumption, less power is typically available to drive electrical signals to required voltage or current levels, forcing the memory system to operate at slower speeds. Although slower operating memory systems may be acceptable in some applications, it is desirable to reduce power consumption without negatively impacting the performance of the memory system.

Therefore, there is a need for alternative approaches to reducing power consumption of memory systems without compromising memory system performance.

DETAILED DESCRIPTION OF PREFERRED EMBODIMENTS

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, and timing protocols have not been shown in detail in order to avoid unnecessarily obscuring the invention.

Figure 1:
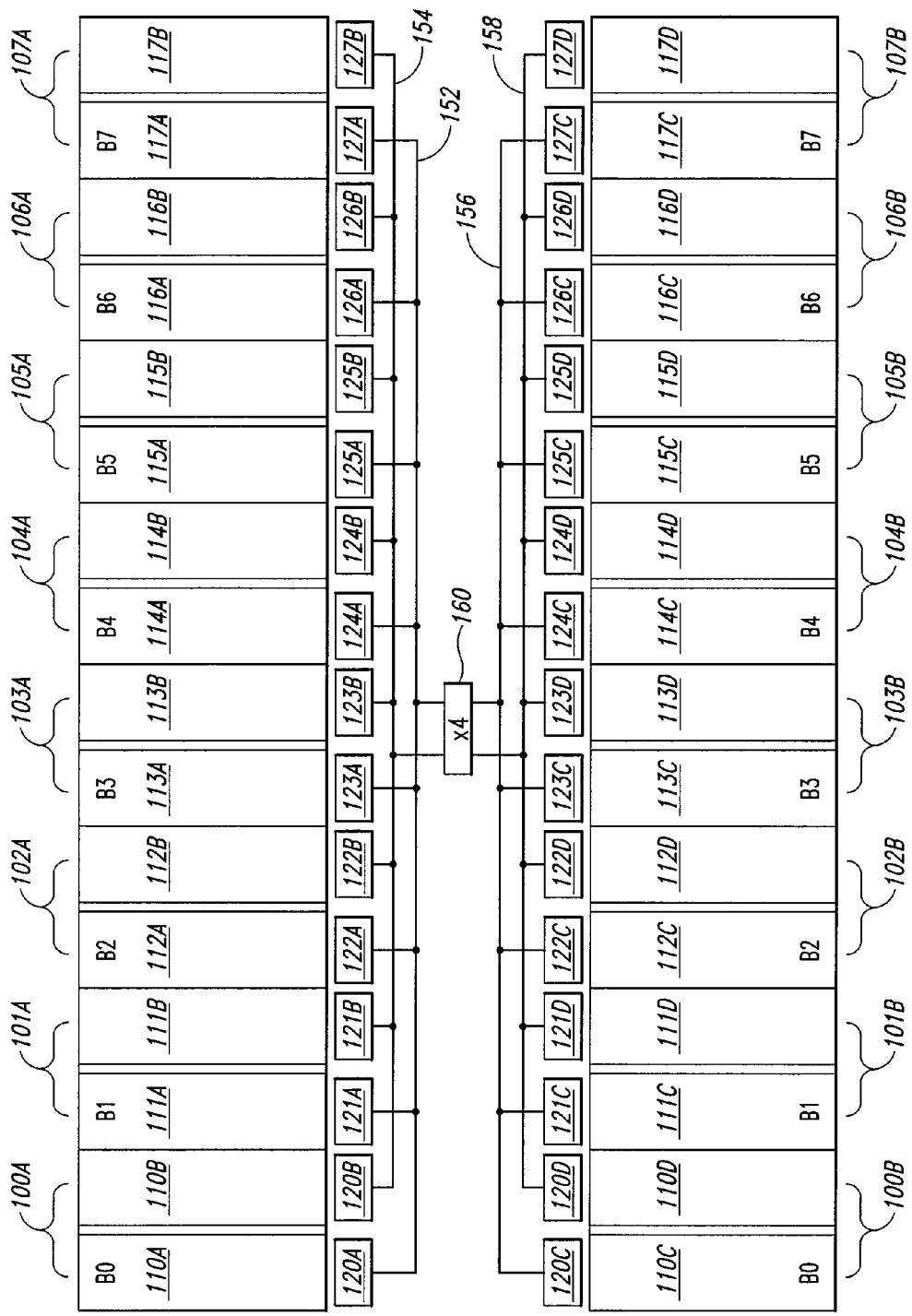
FIG. 1 is a block diagram of a portion of a memory system including an embodiment of the present invention.

FIG. 1 is a functional block diagram of a portion of a memory system 10 in which an embodiment of the present invention may be included. The memory system 10 represents different types and forms of memory systems, including volatile, non-volatile, individual devices, and embedded memory systems. Those ordinarily skilled in the art will obtain sufficient understanding of the invention from the description provided herein to practice the invention in various types and forms of memory. It will further be appreciated by those ordinarily skilled in the art that the particular arrangement of functional blocks shown in FIG. 1 is provided by way of example, and embodiments of the present invention can be included in memory systems having other arrangements as well. Additionally, FIG. 1 is merely illustrative, and not intended to accurately portray the dimensions or scale of the functional blocks of the memory system 10.

The portion of the memory system illustrated in FIG. 1 includes a memory array that is arranged as eight blocks of memory 100-107. Each of the blocks of memory are split into two half-blocks 100A-107A and 100B-107B. Each half-block 100A-107A and 100B-107B is further divided into two quarter-blocks 110. In the arrangement shown, one block of memory, for example, memory block 100, includes the four quarter-blocks 110A, 110B, 110C, and 110D.

Each quarter-block 110 is divided into memory sections (not shown) that have memory cells conventionally arranged in "rows" and "columns." The rows are represented by "word" lines and columns are represented by complementary pairs of digit lines. As known, row and column addresses are provided to the memory system and decoded, and the memory cells corresponding to the addresses are accessed. When a row of memory is accessed, the memory cells associated with the accessed row are coupled to respective pairs of digit lines and the stored data is amplified by column sense amplifiers coupled to the respective pairs of digit lines. Sense amplifiers corresponding to the column address are coupled to provide the amplified data to complementary local input-output lines LIO, LIOF that are associated with the respective memory section. The LIO and LIOF lines of the section having the accessed memory cells are in turn coupled to complementary pairs of global input-output lines GIO, GIOF that are shared by a quarter-block of memory. The sense amplifiers, and the arrangement of the sense amplifiers, LIO, LIOF lines and GIO, GIOF lines (not shown in FIG. 1) are conventional.

Blocks of global input-output line sense amplifiers GIOSAs 120-127 are coupled to the GIO, GIOF lines of a respective quarter block. The GIOSAs of blocks 120-127 are coupled to a respective pair of GIO, GIOF lines to amplify the data of the accessed memory cells of the corresponding quarter-block and generate complementary output signals to be driven onto sets of complementary GDR, GDRF lines 152, 154, 156, and 158. In the embodiment shown in FIG. 1, the quarter blocks 110A-117A, 110B-117B share the sets of GDR, GDRF lines 152, 154 respectively, and the quarter blocks 110C-117C, 110D-117D share the sets of GDR, GDRF lines 156, 158, respectively.

Figure 2:
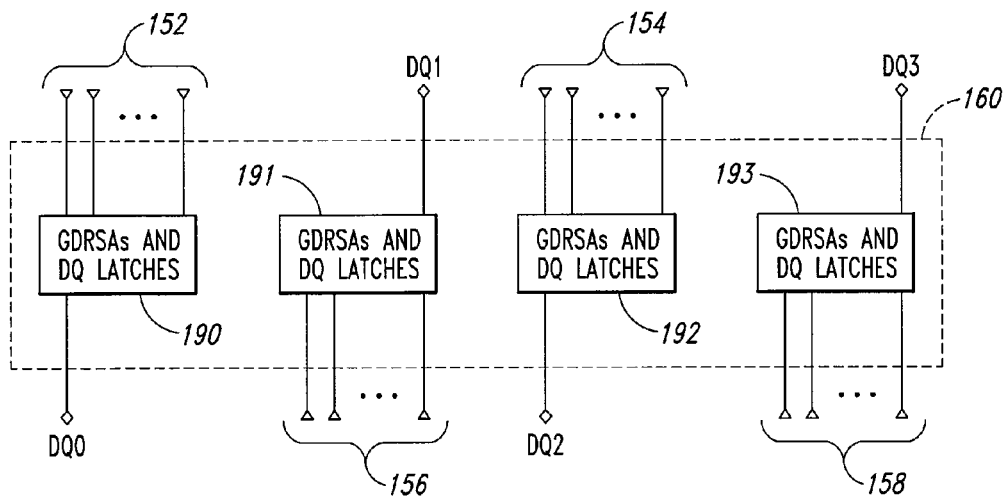
FIG. 2 is a block diagram of a DQ block of the memory system shown in FIG. 1.
Figure 3:
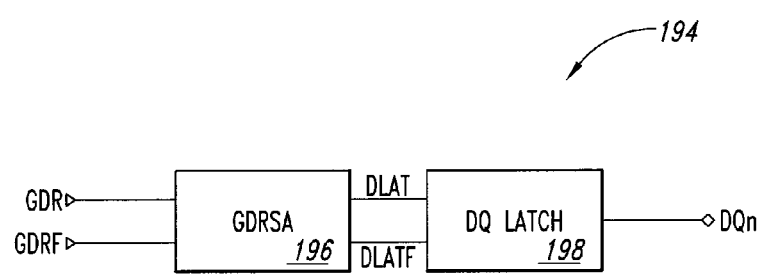
FIG. 3 is a block diagram of a sense amplifier and latch circuit of the DQ block of FIG. 2.

The sets of GDR, GDRF lines 152, 154, 156, 158 couple the output signals of the GIOSAs to DQ block 160 to be sensed and latched to provide output data signals for the memory system 10. Generally, the GIO, GIOF lines, GDR, GDRF lines, GIOSAs and GDRSAs are included in a data path of the memory system 10 that couples data from the cell array sense amplifiers to outputs of the memory system 10. The memory system 10 of FIG. 1 is configured as a ×4 device, that is, 4-bits of data are output from the memory device concurrently in response to a memory read operation. FIG. 2 illustrates the DQ block 160 for a ×4 device in greater detail. The DQ block 160 includes four blocks of GDRSAs and DQ latches 190-193. Each block 190-193 is coupled to one of the sets of GDR, GDRF lines 152, 154, 156, 158, and includes a plurality of GDRSA/latch circuits (not shown) coupled to a respective pair of GDR, GDRF lines. FIG. 3 illustrates a GDRSA/latch circuit 194 that can be used in the DQ block 160. The GDRSA latch circuit 194 includes a conventional GDRSA current sense amplifier 196 that generates complementary output signals on DLAT, DLATF lines based on a current difference between the GDR, GDRF lines of the respective pair. The complementary GDRSA output signals on the DLAT, DLATF lines are in turn latched by a data latch circuit 198 which generates an output data signal DQ. In alternative embodiments, additional DQ blocks are included in the memory system 10 to provide different data configurations for the memory system, for example, to provide a ×8 or ×16 memory system concurrently outputting 8- or 16-bits data, respectively. The specific arrangements previously described have been provided by way of example, and is not intended to limit the scope of the present invention.

Figure 4:
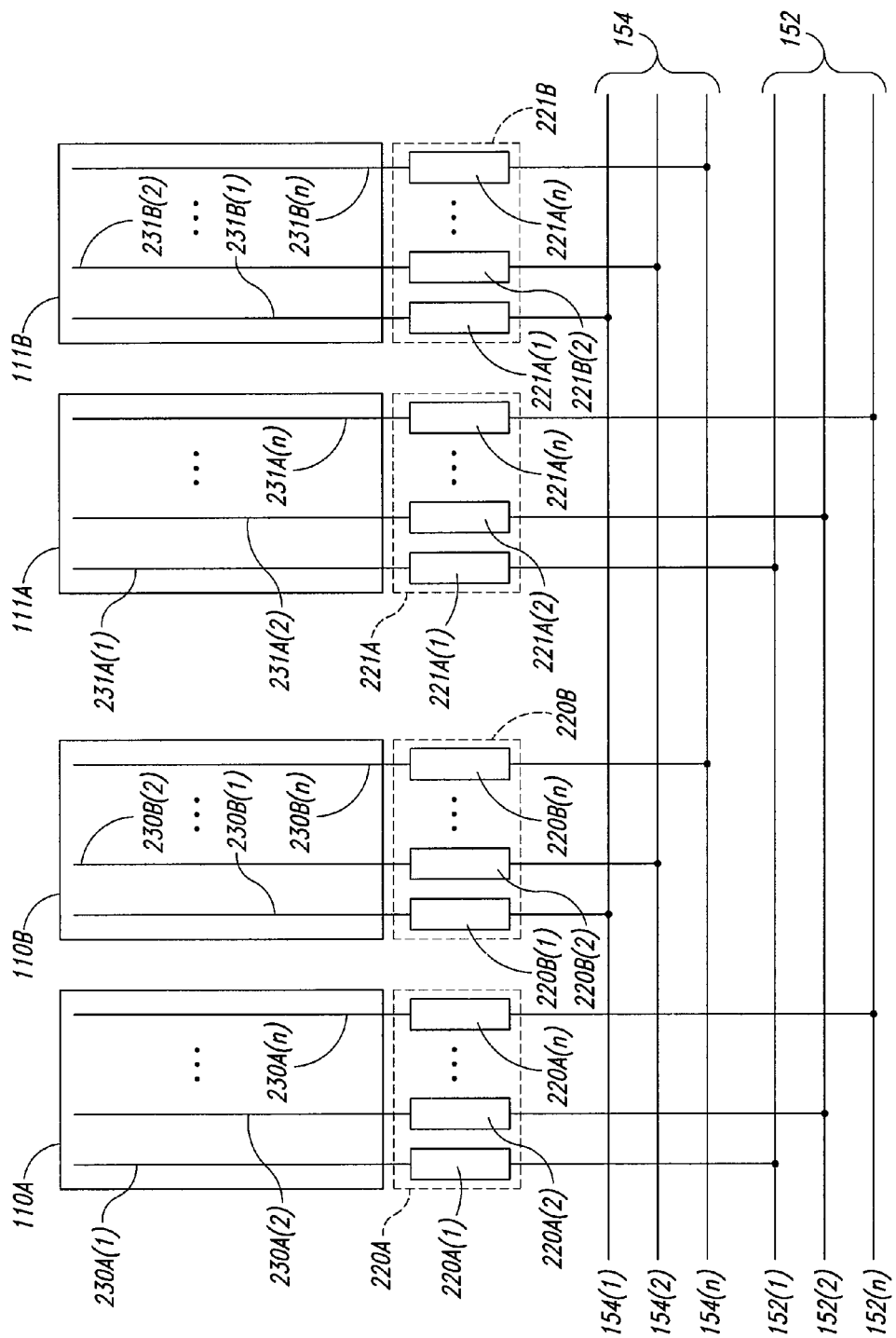
FIG. 4 is a block diagram of a portion of the memory system illustrated in FIG. 1.

Two half-blocks of memory 110 and 111 and corresponding GIOSA blocks 120A, 120B and 121A, 121B are illustrated in more detail in FIG. 4. Each GIOSA of the GIOSA blocks 120A, 120B and 121A, 121B is coupled to a respective complementary pair of GIO, GIOF lines. The pairs of GIO, GIOF lines are represented in FIG. 4 as GIO lines 230A(1)-230A(n) (for quarter-block 110A), GIO lines 230B(1)-230B(n) (for quarter-block 110B), GIO lines 231A(1)-231A(n) (for quarter-block 111A), and GIO lines 231B(1)-231B(n) (for quarter-block 111B), where "n" represents a whole number greater than zero.

As previously discussed, the GIO lines 230A, 230B, 231A, 231B couple data to and from memory cells in the respective quarter-block 110A, 110B, 111A, 111B. In the case of a read operation, data of memory cells corresponding to a requested memory address are coupled to the GIO lines to be amplified by respective GIOSAs in the GIOSA block. The respective GIOSA generates complementary output signals to drive a complementary pair of GDR, GDRF lines. As previously discussed, the set of GDR, GDRF lines 152 are shared by the quarter-blocks 110A-117A, and the set of GDR, GDRF lines 154 are shared by the quarter-blocks 110B-117B. Each pair of GDR, GDRF lines 152 are represented in FIG. 4 by GDR lines 152(1)-152(n) and each pair of GDR, GDRF lines 154 are represented in FIG. 4 by GDR lines 154(1)-154(n). The GDR lines 152, 154 couple the GIOSA output signals to GDRSAs. As previously discussed with reference to FIGS. 2 and 3, the GDRSAs are current sense amplifiers that sense a current differential between GIOSA output signals coupled to the respective pair of GDR, GDRF lines and generate a GDRSA output signal accordingly. The GDRSA output signals are latched by data latches and used to generate output data signals.

Figure 5:
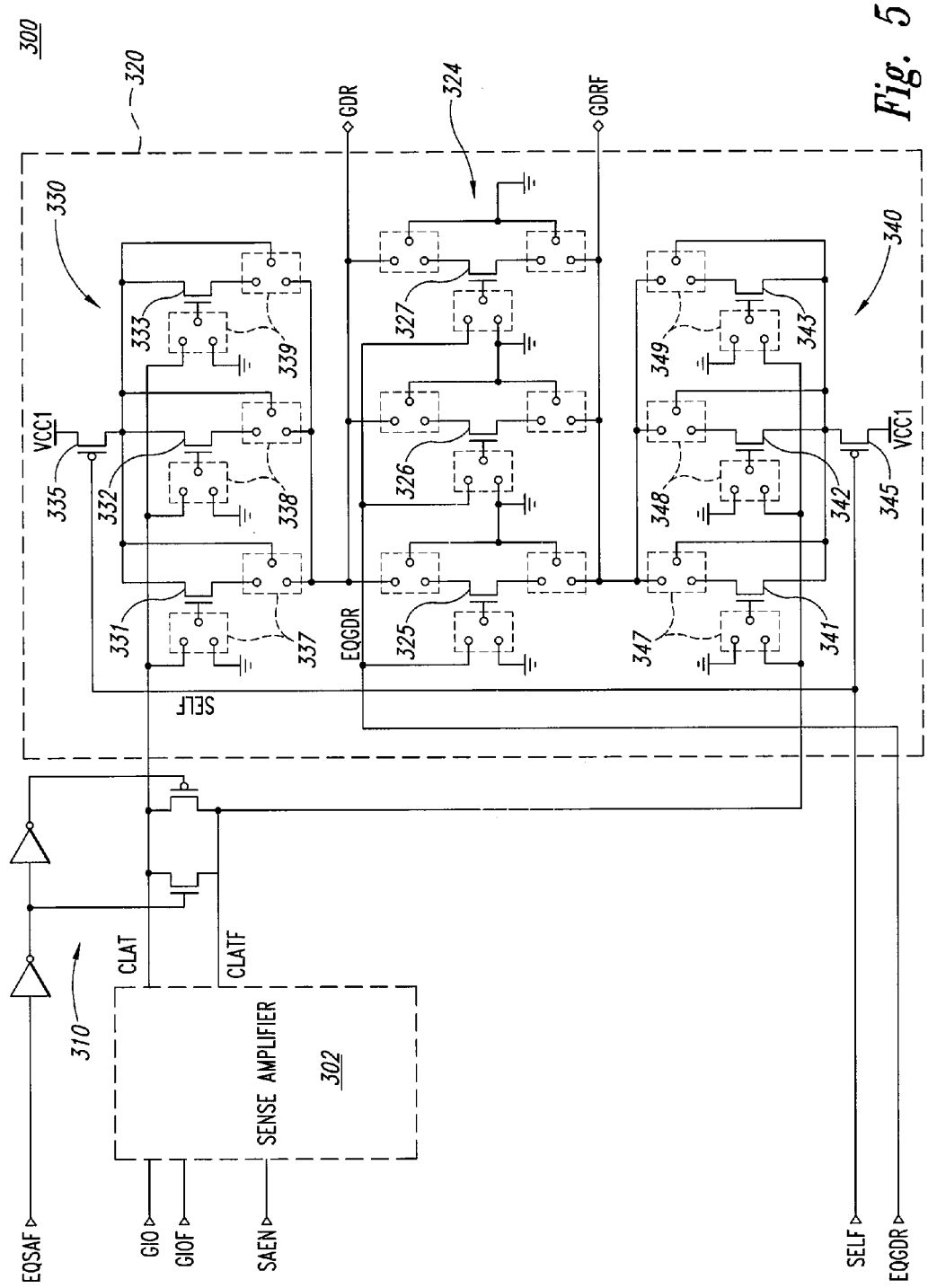
FIG. 5 is a schematic diagram of a global input-output line sense amplifier circuit according to an embodiment of the present invention.

FIG. 5 illustrates a GIOSA 300 according to an embodiment of the present invention. The GIOSA can be substituted for the GIOSAs previously discussed with reference to FIGS. 1 and 4. The GIOSA includes a sense amplifier 302 and a GDR current driver 320. The sense amplifier 302 generates complementary output signals on CLAT, CLATF lines based on the GIOSA output signals coupled to the GIO, GIOF lines. In response, the GDR current driver 320 generates output signals onto a respective pair of GDR, GDRF lines.

The sense amplifier 302 is conventional and has not been shown in detail since sense amplifiers now known or later developed can be used. The sense amplifier 302 is optional, and can be omitted from the GIOSA 300. In such an embodiment, the GIO, GIOF lines are coupled to the GDR current driver 320 through the CLAT, CLATF lines, and the GDR current driver 320 drives complementary output signals onto the respective pair of GDR, GDRF lines based on the logic levels of a respective pair LIO, LIOF lines. Omitting the sense amplifier from a GIOSA may be desirable in applications where the LIO, LIOF lines can be sufficiently driven to complementary logic levels for the GDR current driver 320 to generate output signals that accurately represent the data of the accessed memory cell.

FIG. 5 further illustrates various control circuitry, such as equilibration circuit 310, and control signals, such as sense amplifier enable signal SAEN, sense amplifier equilibration control signal EQSAF, selection signal SELF, and GDR current driver equilibration control signal EQGDR. The sense amplifier 302 is enabled by a HIGH SAEN signal and the GDR current driver 320 is enabled by a LOW SELF signal. Following sensing and amplification, the CLAT, CLATF lines are equilibrated in response to a LOW EQSAF signal and the GDR, GDRF lines are equilibrated in response to a HIGH EQGDR signals. The control circuitry and control signals illustrated in FIG. 5 are included by way of example and are not intended to limit the invention to a particular embodiment having such control signals. Those ordinarily skilled in the art will appreciate that the control signals are typical in a memory system and such signals can be generated using known control circuits.

The GDR current driver 320 includes GDR source follower stage 330, GDRF source follower stage 340, and GDR line equilibration circuit 324. The GDR source follower stage 330 includes n-channel field effect-transistors (NFETs) 331-333 and enable transistor 335. Each of the NFETs 331-333 can be selectively coupled to the CLAT line to be activated in response to a HIGH signal. In the embodiment of FIG. 5, the selective coupling of the NFETs 331, 332, 333 is accomplished by setting switches 337, 338, 339. Similarly, NFETs 341-343 of the GDRF source follower stage 340 are selectively coupled to the CLATF line by setting respective switches 347-349. Switches 337-339, 347-349 also include switches to selectively couple the drains of the respective NFETs 331-333, 341-343 to the respective GDR, GDRF lines. As will be described in more detail below, the switches 337-339, 347-349 are used to selectively couple the NFETs 331-333, 341-343 to be activated in response to signals on the CLAT, CLATF lines, and thus, provide additional current drive capability. Where an NFET 331-333, 341-343 is not to be used for driving current onto the GDR, GDRF line, the switches 337-339, 347-349 are set to couple the source and drain together, and couple the respective gate to ground.

The GDR line equilibration circuit 324 includes NFETs 325-327 that can be selectively coupled to the GDR, GDRF lines and to receive the EQGDR signal by setting respective switches. In this manner, an appropriate combination of NFETs 325-327 for the NFETs of the source follower stages 330, 340 coupled to the GDR, GDRF lines can be used to equalize a potential difference between the two lines in response to a HIGH EQGDR signal.

The current drive capability of the GDR current driver 320 can be tailored by setting switches of the GDR and GDRF source follower stages 330, 340 to couple selected NFETs 331-333, 341-343 to respond to output signals on the CLAT, CLATF lines. Switches of the GDR line equilibration circuit 324 are also programmed to provide sufficient current capacity through the NFETs 325-327 to fully equilibrate the GDR, GDRF lines. The switches of the GDR current driver 320 are conventional. In one embodiment, the switches are metal-option switches that are set during formation of a metal layer during fabrication of the memory system 10. For example, signal lines of a metal layer are formed to couple terminals of the switches in the manner desired, as known in the art. The use of metal-option switches has been provided by way of example. Switches other than metal-option switches can be used as well, for example, conventional antifuses can be used in alternative embodiments.

Coupling combinations of NFETs to the CLAT or CLATF lines changes the drive capability of the respective GDR and GDRF source follower stages 330, 340. In one embodiment, the NFETs of the source follower stages are scaled differently to provide different combinations of current drive capability. For example, NFET 332 can be scaled to have twice the current drive of NFET 331, and NFET 333 can be scaled to have four-times the current drive of NFET 331. The previously described arrangement can provide different levels of current drive by selectively setting the switches 337-339 to couple the respective NFET to the CLAT line. Assuming the NFET 331 by itself drives "i" uA when activated, the following combinations of current drive for the GDR line are available: i (only NFET 331), 2i (only NFET 332), 3i (NFETs 331 and 332), 4i (only NFET 333), 5i (NFETs 331 and 333), 6i (NFETs and 332 and 333), and 7i (all NFETs 331-333). The same arrangement of differently scaled NFETs can be used for the CLATF source follower stage 340 as well. In alternative embodiments, the NFETs can be similarly scaled, or scaled differently than specifically provided in the previous example. Additionally, although the GDR and GDRF source follower stages 330, 340 have been described as using NFET devices, different types of transistors and p-type transistors can be used as well.

In conventional memory systems, all of the GIOSAs typically have the same current drive capability and cannot be adjusted. In contrast, the current drive capability of a GIOSA according to an embodiment of the present invention can be tailored. For example, current drive capability of the GIOSAs can be tailored according to their location relative to the GDRSAs (included in the DQ block 160). For example, GIOSAs that are located relatively close to the GDRSAs, such as GIOSAs of GIOSA blocks 123A-123D for memory block 103, only have a relatively short length of the GDR, GDRF lines 152-158 to drive current to the DQ block 160. In contrast, GIOSAs that are located further away from the GDRSA, such as GIOSAs of GIOSA blocks 120A-120D for memory block 100, have a relatively longer length of the GDR, GDRF lines 152-158 to drive current to the DQ block 160. As known, the load of a signal line is proportional to the length over which a signal must be driven. Thus, the GIOSAs that are located closer to the GDRSAs and drive the GIOSA signals over a relatively shorter length of the GDR, GDRF lines 152-158 have less electrical load to drive, and consequently, need less drive capability than the GIOSAs that is located further away from the GDRSAs. For example, the GIOSAs of blocks 123A-123D can be tailored to have less current drive capability than the GIOSAs of blocks 127A-127D, due to the lighter electrical load, that is, driving current over a shorter length of the GDR, GDRF lines 152-158.

Tailoring of the current drive capability of the GIOSAs to reduce "excess" drive capability of some of the GIOSAs can provide various advantages. For example, excess current drive capability can overdrive a pair of GDR, GDRF lines to have an unwanted voltage difference. As previously discussed, the GDRSAs include a current sense amplifier to sense a current differential in a pair of GDR, GDRF lines. Creating a voltage difference between GDR and GDRF lines is not necessary for accurately sensing data. However, any voltage difference between the GDR, GDRF lines must be discharged during a precharge/equilibration process before the next access operation can be performed. The greater the voltage difference, the more time that is required to sufficiently discharge and equilibrate the GDR, GDRF lines, which correspondingly increases the overall access cycle time of a memory system. Thus, reducing the voltage difference between GDR, GDRF lines that must be discharged can improve access cycle time for a memory system. Additionally, the unwanted voltage difference between GDR, GDRF lines increases power consumption of the memory system since the resulting voltage difference does not improve sensing accuracy and is merely discharged at the end of the access cycle.

Figure 6:
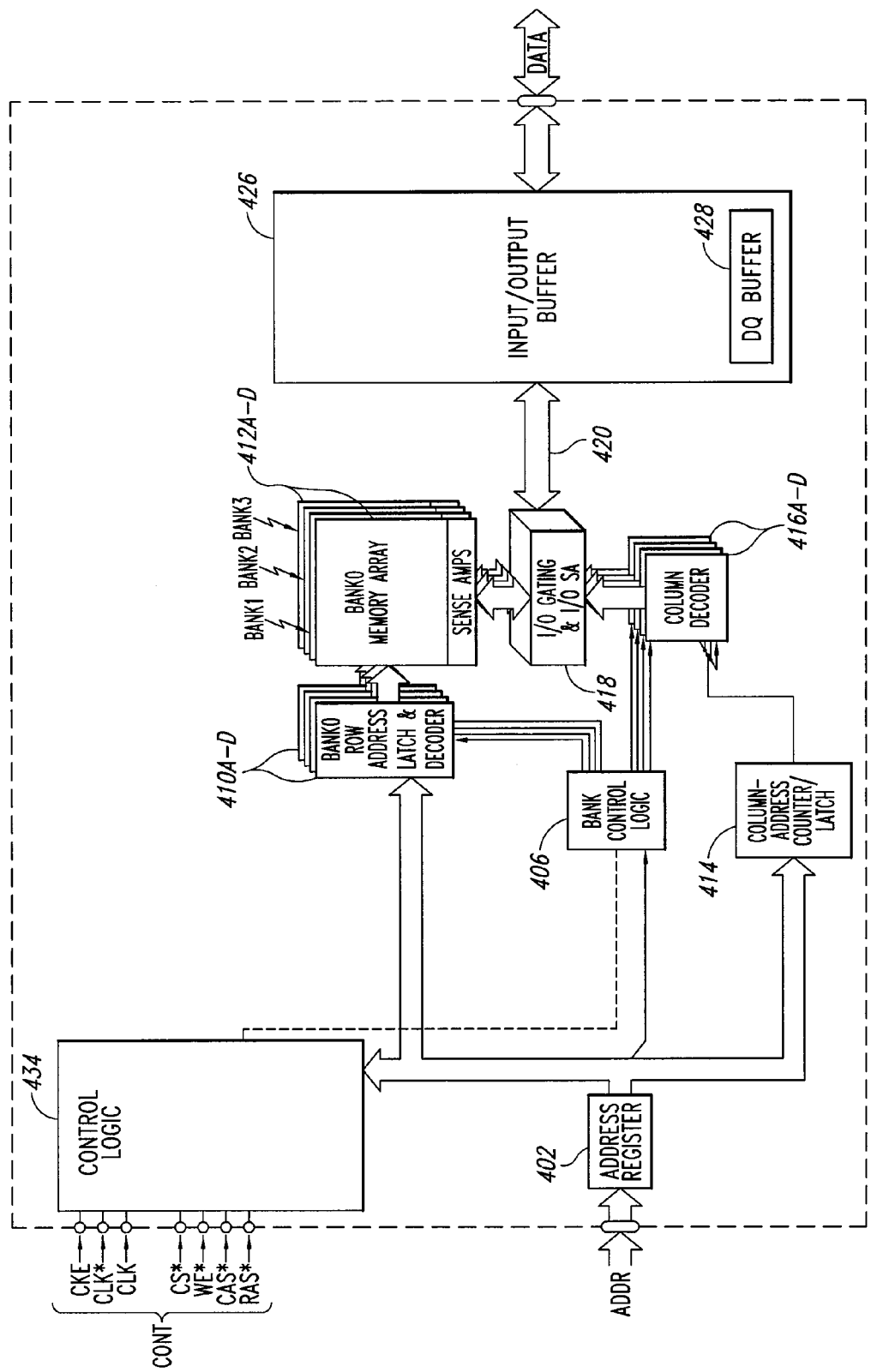
FIG. 6 is a block diagram of a memory system including an embodiment of the present invention.

FIG. 6 is a functional block diagram of a memory system 400 that includes input-output line sense amplifiers according to an embodiment of the present invention. The memory device 400 in FIG. 6 will be described as a synchronous dynamic random access memory (SDRAM), although principles described herein are applicable to any memory system that may include input-output line sense amplifiers. For example, the clock enable signal CKE enables clocking of the command decoder 434 by the clock signals CLK, CLK* to latch and decode an applied command, and generate a sequence of internal clocking and control signals that control various components of the memory system 900 to execute the function of the applied command. When enabled by the CKE signal, the input/output buffer transfers data from and into the memory device 400 for read and write operations, respectively, in response to the CLK, CLK* signals. For example, the clock enable signal CKE enables clocking of the command decoder 434 by the clock signals CLK, CLK* to latch and decode an applied command, and generate a sequence of internal clocking and control signals that control various components of the memory system 400 to execute the function of the applied command. When enabled by the CKE signal, an input/output buffer 426 transfers data from and into the memory device 400 for read and write operations, respectively, in response to the CLK, CLK* signals.

A control logic and command decoder 434 receives a plurality of command and clocking signals over a control bus CONT, typically from an external circuit such as a memory controller (not shown). The command signals include a chip select signal CS*, a write enable signal WE*, a column address strobe signal CAS*, and a row address strobe signal RAS*, while the clocking signals include a clock enable signal CKE* and complementary clock signals CLK, CLK*, with the "*" designating a signal as being active low. The command signals CS*, WE*, CAS*, and RAS* are driven to values corresponding to a particular command, such as a read or a write command. The clock enable signal CKE enables operation of the memory system 400 according to the CLK, CLK* signals.

The memory device 400 further includes an address register 402 that receives row, column, and bank addresses over an address bus ADDR, with the a memory controller (not shown) typically supplying the addresses. The address register 402 receives a row address and a bank address that are applied to a row address latch and decoder and bank control logic circuit 406, respectively. The bank control logic 406 activates the row address latch and decoder 410A-D corresponding to either the bank address received from the address register 402, and the activated row address latch and decoder latches and decodes the received row address. In response to the decoded row address, the activated row address latch and decoder 410A-D applies various signals to a corresponding memory bank 412A-D to thereby activate a row of memory cells corresponding to the decoded row address. Each memory bank 412A-D includes a memory-cell array having a plurality of memory cells arranged in rows and columns, and the data stored in the memory cells in the activated row is stored in sense amplifiers in the corresponding memory bank.

A column address is also applied on the ADDR bus after the row and bank addresses, and the address register 402 applies the column address to a column address counter and latch 414 which, in turn, latches the column address and applies the latched column address to a plurality of column decoders 416A-D. The bank control logic 406 activates the column decoder 416A-D corresponding to the received bank address, and the activated column decoder decodes the applied column address. In response to the column address from the counter and latch 414, the activated column decoder 416A-D applies decode and control signals to an I/O gating circuit 418 which, in turn, accesses memory cells corresponding to the decoded column address in the activated row of memory cells in the memory bank 412A-D being accessed.

In operation, during data read operations, data being read from the addressed memory cells are coupled through the I/O gating and sense amplifier circuit 418 and a data path 420 to an input/output buffer 426. The input/output buffer 426 latches data in a DQ buffer 428 and provides data from the memory device 400 onto a data bus DATA in accordance with the CLK, CLK* signals when the memory system 400 is enabled by the CKE signal. Input-output line sense amplifiers according to an embodiment of the invention are included in the I/O gating and I/O sense amplifier circuit 418 to drive data signals onto the data path 420 to the DQ buffer 428 included in the input/output buffer 426. The input/output line sense amplifiers can be tailored to have different output drive capacities, as previously discussed. During data write operations, an external circuit such as a memory controller (not shown) applies data to the data bus DATA which are clocked into the input/output buffer 426 in accordance with the CLK, CLK* signals. The data are then provided to the memory array through the data path 420 and the I/O gating and I/O sense amplifier circuit 418 to be stored by memory cells in the memory bank 412A-D that correspond to the row, column, and bank addresses.

Figure 7:
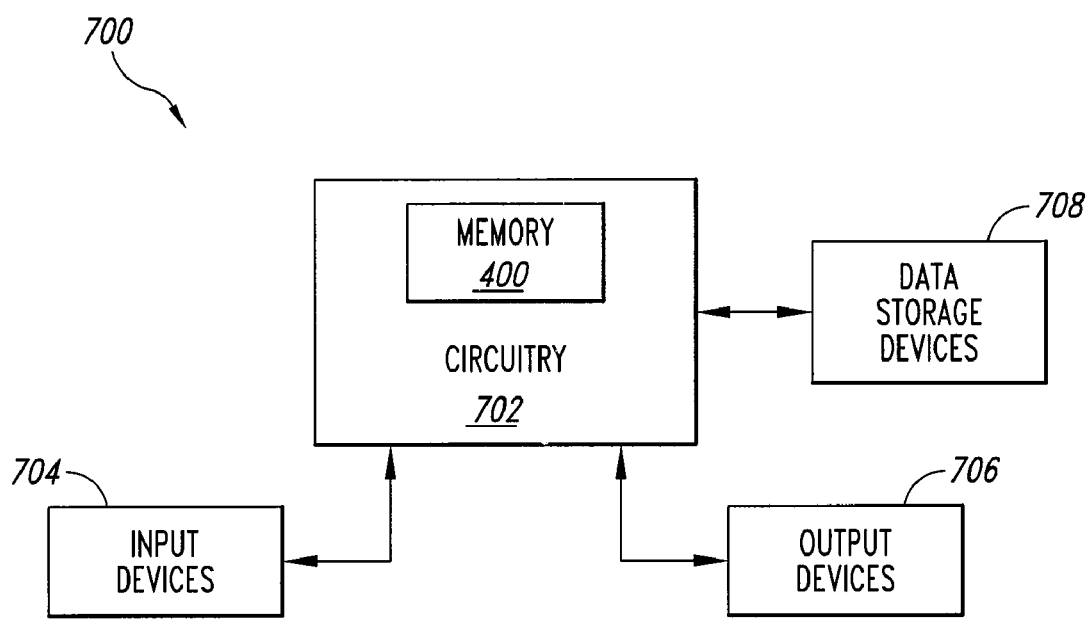
FIG. 7 is a functional block diagram illustrating a processor-based system including the synchronous memory device of FIG. 6.

FIG. 7 is a block diagram of a processor-based system 700 including processor circuitry 702, which includes the memory device 400 of FIG. 6. Typically, the processor circuitry 702 is coupled through address, data, and control buses to the memory device 400 to provide for writing data to and reading data from the memory device. The processor circuitry 702 includes circuitry for performing various processing functions, such as executing specific software to perform specific calculations or tasks. In addition, the processor-based system 700 includes one or more input devices 704, such as a keyboard or a mouse, coupled to the processor circuitry 702 to allow an operator to interface with the processor-based system 700. Typically, the processor-based system 700 also includes one or more output devices 706 coupled to the processor circuitry 702, such as output devices typically including a printer and a video terminal. One or more data storage devices 708 are also typically coupled to the processor circuitry 702 to store data or retrieve data from external storage media (not shown). Examples of typical storage devices 708 include hard and floppy disks, tape cassettes, compact disk read-only ("CD-ROMs") and compact disk read-write ("CD-RW") memories, and digital video disks ("DVDs").

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method for latching data in a data output circuit of a memory, comprising:

driving a first data signal on an input-output line according to a first output drive setting by activating a first combination of transistors of a first set of transistors to couple the input-output line to a power supply, the first data signal representing first data;

sensing the first data signal, and in response, generating an output data signal representing the first data;

latching the first data;

driving a second data signal on the input-output line according to a second output drive setting by a second combination of transistors of a second set of transistors to couple the input-output line to the power supply, the second data signal representing data, the first and second sets of transistors having the same sized transistors and the first and second combinations different;

sensing the second data signal, and in response, generating an output data signal representing the second data; and latching the second data.

2. The method of claim 1 wherein driving the first data signal on the input-output line according to a first output drive setting comprises driving a first current signal on the input-output line according to a first current drive setting.

3. The method of claim 1 wherein each of the transistors of the first set have different current capacities and the transistors of the second set have the same different current capacities as the first set.

4. The method of claim 1 wherein each of the transistors of the first set have different transistor dimensions and the transistors of the second set have the same different transistor dimensions as the first set.

5. The method of claim 1 wherein driving a first data signal on an input-output line comprises driving complementary data signals over a pair of complementary input-output lines.

6. A method for configuring a memory system, comprising:

setting a first input-output line current driver circuit to have a first output drive capacity based on an electrical load of a signal line on which output data is driven by the first input-output line current driver; and setting a second input-output line current driver circuit to have a second output drive capacity, the second output drive capacity different than the first output drive capacity.

7. The method of claim 6 wherein setting the first input-output line current driver circuit to have a first output drive capacity comprises:

setting a plurality of switches to selectively couple transistors to an input-output line on which data signals are provided.

8. A method for configuring a memory system, comprising:

setting an input-output line sense amplifier to have an output drive capacity based on the length of a signal line over which the input-output line sense amplifier drives complementary signals to an output driver, at least two input-output line sense amplifiers of the memory system set to different output drive capacities driving respective data over two different lengths of signal lines.

9. The method of claim 8 wherein setting the input-output line sense amplifier comprises setting a plurality of switches to selectively couple transistors to an input-output line on which data signals are provided.

10. The method of claim 9 wherein setting a plurality of switches comprises setting a plurality of metal option switches.

11. A method for latching data in a data output circuit of a memory, comprising:

driving a first current signal over a first distance on an input-output line according to a first output drive setting, the first current signal representing first data;

sensing the first data signal, and in response, generating an output data signal representing the first data;

latching the first data;

driving a second current signal over a second distance on the input-output line according to a second output drive setting, the second current signal representing second data and the second distance different than the first distance;

sensing the second data signal, and in response, generating an output data signal representing the second data; and latching the second data.

12. A method for latching data in a data output circuit of a memory, comprising:

driving a first current signal over a first electrical load of an input-output line according to a first output drive setting, the first current signal representing first data;

sensing the first data signal, and in response, generating an output data signal representing the first data;

latching the first data;

driving a second current signal over a second electrical load of the input-output line according to a second output drive setting, the second current signal representing data and the second electrical load greater than the first electrical load;

sensing the second data signal, and in response, generating an output data signal representing the second data; and latching the second data.

* * * * *